(12) United States Patent
Saito et al.

(10) Patent No.: US 6,308,861 B1
(45) Date of Patent: *Oct. 30, 2001

(54) CHIP COMPONENT FEEDING APPARATUS AND ATTRACTING PLATE FOR USE IN SAME

(75) Inventors: Koji Saito; Taro Yasuda, both of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/590,281

(22) Filed: Jun. 9, 2000

Related U.S. Application Data

(63) Continuation of application No. 08/948,332, filed on Oct. 10, 1997, now Pat. No. 6,073,800.

(30) Foreign Application Priority Data

Nov. 15, 1996 (JP) ................................................ 8-305271

(51) Int. Cl.[7] ................................................ B65G 59/04
(52) U.S. Cl. ................ 221/212; 221/312 R; 198/690.1; 269/8
(58) Field of Search ................................ 221/212, 224, 221/312 R, 341; 198/679, 690.1; 209/904, 907; 269/8

(56) References Cited

U.S. PATENT DOCUMENTS

| | | |
|---|---|---|
| 4,236,632 | 12/1980 | Spodig . |
| 4,351,430 * | 9/1982 | Mojden ........................... 198/690.1 |
| 4,362,077 * | 12/1982 | Gerber ................................... 269/8 |
| 4,953,747 | 9/1990 | Kubota et al. . |
| 5,265,792 | 11/1993 | Harrah et al. . |
| 5,285,929 | 2/1994 | Aoyama . |
| 5,570,812 | 11/1996 | Ando et al. . |
| 5,730,317 * | 3/1998 | Mitsushima et al. ................ 221/236 |
| 5,816,385 * | 10/1998 | Ootsuki et al. .................. 198/690.1 |
| 5,853,108 * | 12/1998 | Ando et al. ......................... 221/211 |

FOREIGN PATENT DOCUMENTS 6-232596   8/1994  (JP) .

* cited by examiner

Primary Examiner—H. Grant Skaggs
(74) Attorney, Agent, or Firm—Lowe Hauptman Gilman & Berner, LLP

(57) ABSTRACT

A chip component feeding apparatus translates chip components in alignment along a passage and feeds the foremost chip component to a predetermined take-out position. The foremost chip component is separated from the remaining translated chip components. A stopper is displaceable between a predetermined stop position where the foremost chip component stops, and a predetermined take-out position spaced from the stop position. A first attracting section attracts the foremost chip component to the stopper to displace the stopper and the foremost chip component at the stopped position. A second attracting section attracts the foremost chip component to a transport belt.

15 Claims, 14 Drawing Sheets

CHIP COMPONENT FEEDING APPARATUS AND ATTRACTING PLATE FOR USE IN SAME

This application is a continuation of application Ser. No. 08/948,332 filed Oct. 10, 1997, now U.S. Pat. No. 6,073,800.

FIELD OF THE INVENTION

This invention relates to a chip component feeding apparatus in which chip components accommodated in a bulk state are transported in alignment and the foremost chip component fed to a predetermined take-out position, and to an attracting plate for use in the apparatus to facilitate such transport.

DESCRIPTION OF THE RELATED ART

A chip component feeder disclosed in Japanese Patent Laid-open Pub. No. Hei 6-232596 has a box accommodating chips in a bulk state, with a vertically movable component take-in tube inserted into the bottom of the box. A component transport tube extends below and in communication with the component take-in tube, a belt at one end of the component transport tube transports chip components discharged therefrom, and a mechanism is provided for intermittently moving the belt in a predetermined pitch. Also included are a cover with a passage for aligning the chip components being transported by the belt and a stopper for stopping the chip components being transported in alignment along the passage.

In this known chip component feeder, the component take-in tube is moved up and down to load the chip components within the accommodation box one by one in a predetermined orientation into the component take-in tube, the components are discharged onto the belt through the component transport tube, and then transported in alignment by the belt toward the stopper. The components are stopped by the stopper, which moves forward to the foremost chip component which is then fed to a take-out position.

In the above-described apparatus, the stopper is merely separated from the foremost chip component after the stopper stops the chip component transported in alignment by the stopper. As a result, the foremost and succeeding chip components have a tendency to adhere to each other under certain circumstances, e.g., due to the influence of moisture or process liquid used in the component manufacturing step. The problem also arises if there is sufficient surface unevenness on the foremost chip and succeeding chip components. Defective unloading sometimes occurs because the posture of the foremost chip component is disturbed as the component is fed to the take-out position because, e.g., of an attracting nozzle or the like.

Because the chip components in the prior art chip component feeder have small sizes and extremely light weight they tend to be displaced out of alignment merely by contact friction with adjacent surfaces or the like.

SUMMARY OF THE INVENTION

It is therefore an object of present invention to provide a new and improved chip component feeding apparatus for reliably moving a foremost chip component away from succeeding chip components being transported in alignment.

Another object is to provide a new and improved chip component feeding apparatus for transporting chip components so they are in alignment with an attracting plate.

According to one aspect of the invention an apparatus for transporting chips in alignment along a passage feeds a foremost chip component to a predetermined take-out position. A stopper is displaced between a predetermined stop position where the aligned chips are stopped by the stopper and a predetermined take-out position spaced from the stop position. The foremost chip component is displaced from the stopped position to a take-out position by the stopper and a first attracting section to facilitate chip component displacement. A second attracting section retains the chip component retention by attracting the foremost chip component to the passage, after the foremost component has been displaced by the stopper to the take-out position.

According to another aspect of the invention, the foremost chip component is fed to a predetermined take-out position. An attracting section maintains intimate contact of the transported components to attract them toward the passage as the components move in alignment along the passage. This attracting section is preferably on a plate that is removably attached to the apparatus.

DESCRIPTION OF THE DRAWINGS

These and other related objects, aspects, features and advantages of the present invention will become apparent from the following detailed description in conjunction with the accompanying drawings in which.

DESCRIPTION OF THE PREFERRED EMBODIMENTS

Figure 1:
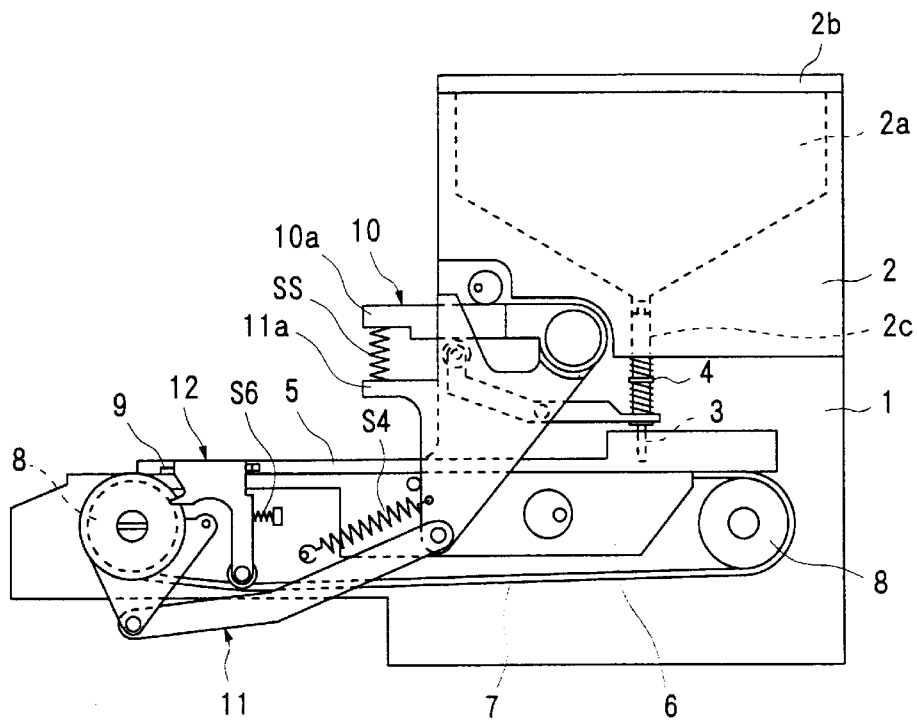
FIG. 1 is a side view of a chip component feeding apparatus according to the first preferred embodiment.
Figure 2:
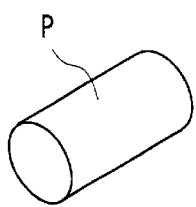
FIGS. 2(*a*) to 2(*c*) are perspective views of exemplary chip components.
Figure 2:
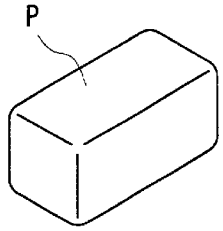
Figure 2:
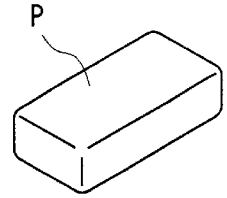

FIGS. 1 to 15, illustrations of a first preferred embodiment of the present invention, horizontally include a frame 1, a hopper 2 for receiving chip components, a fixed pipe 3, a vertically translatable pipe 4, a chip component guide 5, a belt guide 6, a belt 7 for horizontally transporting the chips, front and rear pulleys 8, 8 for belt 7, a stopper 9 for the chip components, a drive mechanism 10 for raising and lowering pipe 4, a mechanism 11 for driving belt 7 via one of pulleys 8, and a mechanism 12 for (1) turning stopper 9 between horizontally and vertically extending directions, as well as (2) driving the stopper horizontally.

Figure 3:
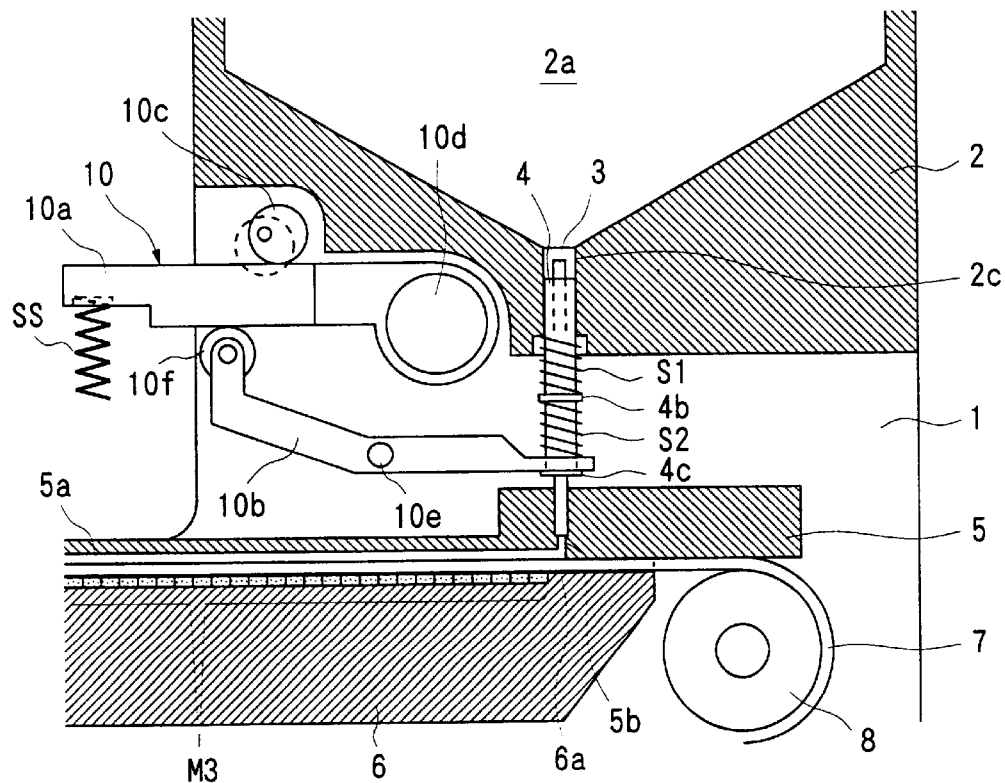
FIG. 3 is a detailed view of a pipe raising/lowering mechanism.

The hopper 2, as best seen in FIGS. 1 and 3, includes an accommodation chamber 2a for receiving the chip components, a cover plate 2b for selectively uncovering and covering an opening at the upper end of accommodation chamber 2a, and a circular bottom opening 2c for slidingly receiving the movable pipe 4 extending through the bottom of the accommodation chamber 2a. The side surface of hopper 2 is removably mounted on frame 1.

A multiplicity of chip components P in a bulk state are supplied to the accommodation chamber 2a. Chip components P may have any shape, e.g., the cylindrical, prism-like, or flat prism-like shapes per FIGS. 2(a), 2(b) and 2(c), respectively. Exemplary of the chip components P are chip capacitors, chip inductors, and chip resistors. The chip component P has an external electrode and an internal conductor or the like; at least one of the electrode or internal conductor includes at least a portion having high magnetic permeability so the chip component is capable of being attracted by a permanent magnet. The chip components P accommodated within hopper 2 are moved by their own weight along the hopper inclined bottom surface toward opening 2c.

Figure 4:
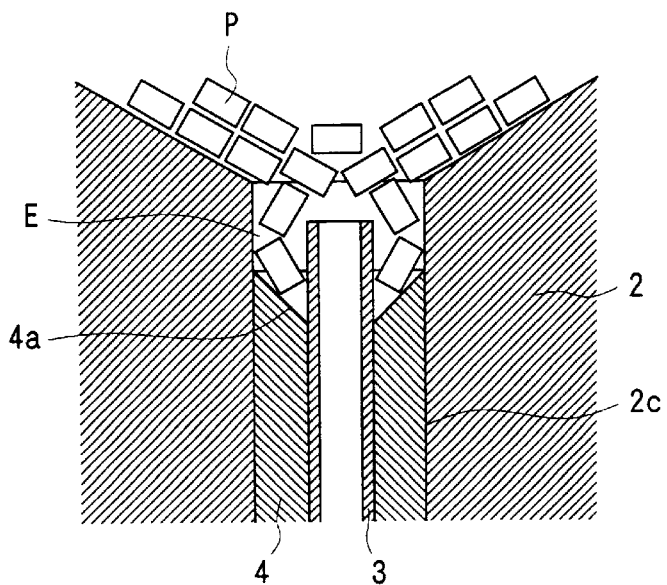
FIG. 4 is a detailed view showing a movable pipe in its lowered position.

The fixed pipe 3 has either a circular or square cross section and a predetermined length. As shown in FIGS. 3 and 4, the lower end of the fixed pipe is fixed to the component guide 5. Fixed pipe 3 is positioned vertically in opening 2c with the upper end of fixed pipe 3 slightly below the upper end of the opening 2c, as best seen in FIG. 4. Fixed pipe 3 has an outer dimension smaller than the maximum length of any of the chip components P to be fed through it. The inner dimension of fixed pipe 3 is slightly larger than the maximum transverse dimension of any of the chip components P to be fed through it. The chip components P are originally located randomly within the accommodation chamber 2a and are thus vertically fed in their longitudinal orientation, one by one to the upper opening of the fixed pipe 3. Components then fall under their own weight in fixed pipe 3 while remaining in the same vertical orientation.

As also shown in FIGS. 3 and 4, the outer dimension of movable pipe 4 is slightly smaller than the diameter of the opening 2c and the fixed pipe inner dimension is slightly greater than the outer dimension of the fixed pipe 3; movable pipe 4 has the same cross-sectional shape as fixed pipe 3. Movable pipe 4 is located around and outside the fixed pipe 3 and is driven vertically movable relative to the fixed pipe so the upper end of the movable pipe is slightly below the upper end of fixed pipe 3. Movable pipe 4 has an outer dimension slightly larger than the maximum length of the chip components P, and includes at its upper end a downwardly tapered central conical guide surface 4a. Engagement jaws 4b and 4c are respectively mounted on the outer surface intermediate portion and the outer surface lower end portion of movable pipe 4. See FIG. 3. Coiled compressing springs S1 and S2 are disposed above and below the intermediate jaw 4b and exert respective biasing forces such that a downward biasing force of spring S1 on jaw 4b is less than an upward biasing force exerted on jaw 4b by spring S2.

Figure 12:
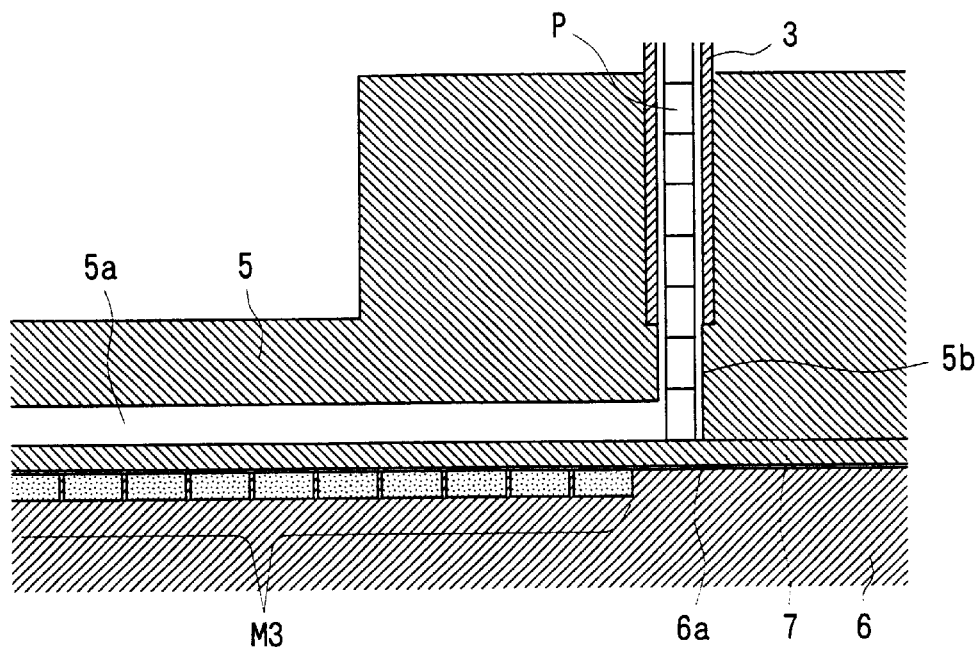
FIG. 12 is a sectional view to explain how components are delivered onto the belt.
Figure 13:
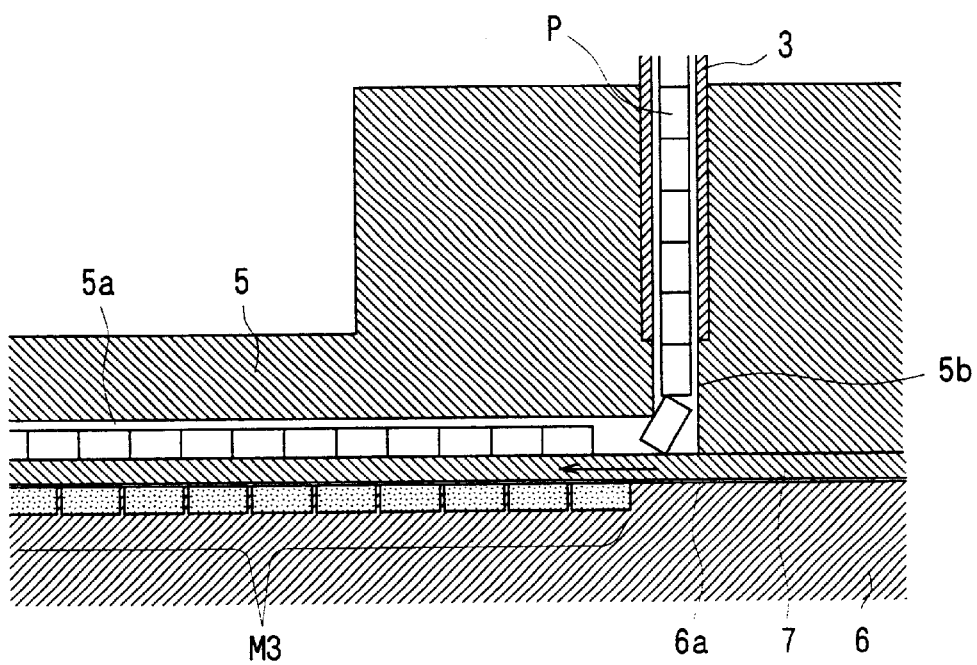
FIG. 13 is a diagram also showing a component being delivered onto the belt.
Figure 14:
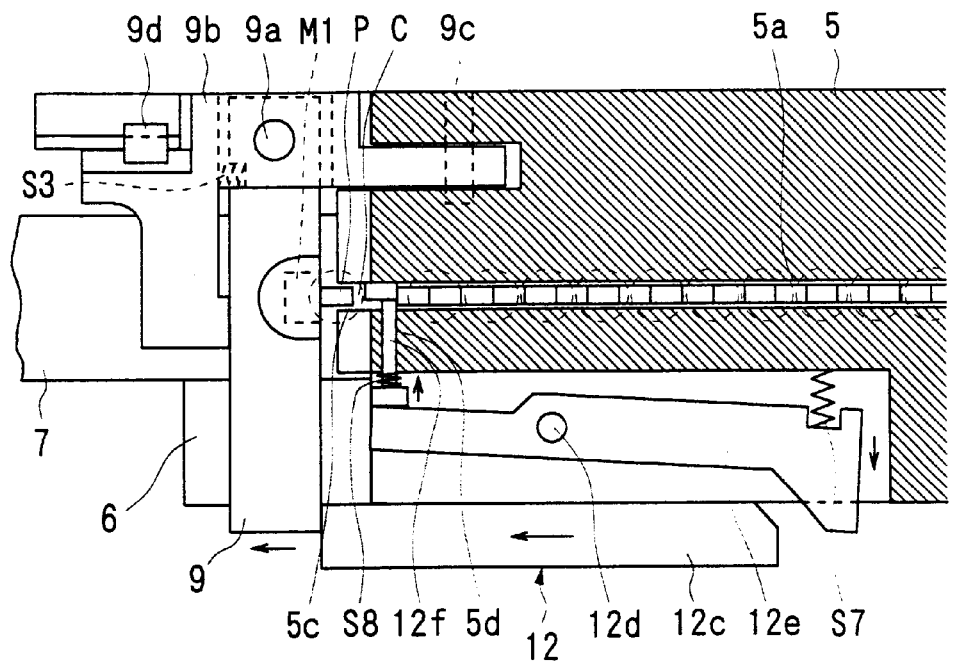
FIG. 14 is a detailed view of a stopper displacement mechanism.

As shown in FIGS. 3, 12 and 14, a bottom of component guide 5 includes an elongated central passage 5a having a predetermined width and depth corresponding to the side dimensions of the chip component P to be fed therethrough. Guide 5 also has a side surface secured to the frame 1. The end of the passage 5a in the interior of guide 5 opens into a vertical passage 5b of a circular or rectangular cross-section; passage 5b communicates with a bore of the fixed pipe 3. In the examples shown in FIGS. 3, 12 and 14, the bore of the fixed pipe 3 and the vertical passage 5b cooperatively define a component delivery passage for conveyance of chip components P from the hopper 2, one by one in their longitudinal orientation, to allow each component P to drop by gravity onto a movable belt 7. As illustrated in FIG. 14, component take out port 5c of passage 5a is at an exterior face of guide 5 proximate stopper 9. The upper surface of the foremost chip component P is exposed to the exterior, i.e., emerges from passage 5a at port 5c.

As shown in FIGS. 3, 7, 8 and 12, belt guide 6 has a top surface including an elongated guide groove 6a which receives belt 7; groove 6a has a predetermined width and depth corresponding to the belt 7. Belt guide 6 is arranged below component guide S in such a manner that the center in the width direction of the guide groove 6a coincides with the center in width of the passage 5a. Belt guide 6 has a side surface secured to frame 1.

Figure 7:
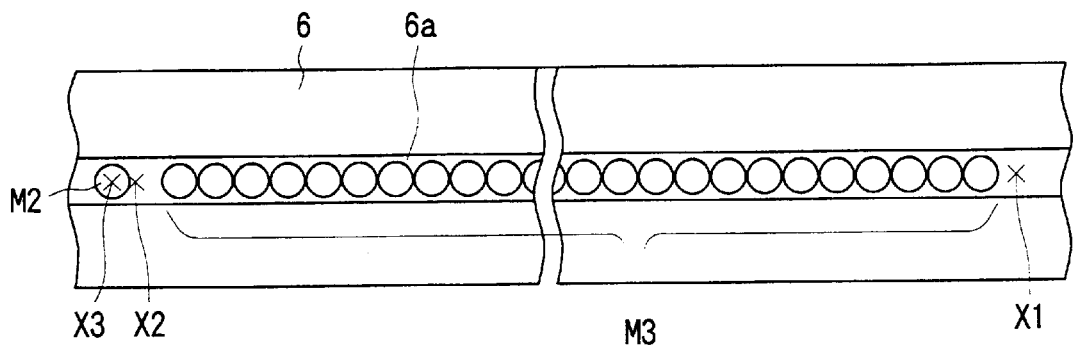
FIG. 7 is a partial top plan view of a belt guide.
Figure 8:
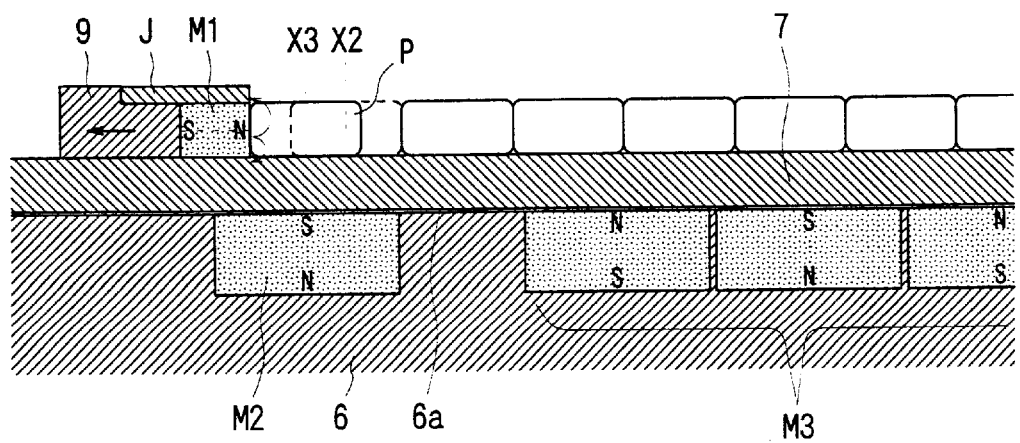
FIG. 8 is a sectional view showing a positional relationship between a chip component displaced to a component take-out position and first and second attracting sections according to the first embodiment.
Figure 9:
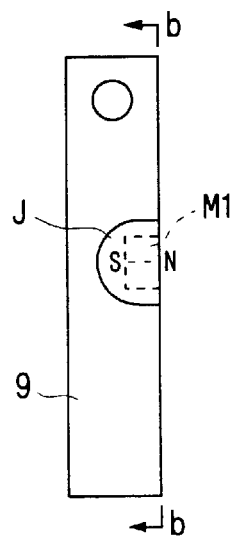
FIGS. 9(*a*) and 9(*b*), respectively, are a top plan view of a component stopper and a sectional view thereof taken along line b—b.
Figure 9:
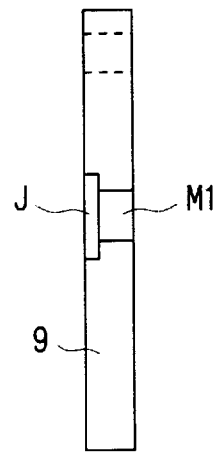

As shown in FIG. 7, the bottom surface of guide groove 6a (of belt guide 6) located below the region of belt 7 used for transporting components P, includes a third magnetic attracting section M3 for intimate contact with the transported components. First and second magnetic attracting sections M1 and M2 are described in detail later. As shown in FIG. 8, third attracting section M3 does not extend to component delivery position X1 (where chip components P are delivered from vertical passage 5b onto belt 7) or to the component stop position X2; X2 is where the foremost chip component P is located when the transported aligned chip components P are stopped by the stopper 9. It is to be understood that the term "the region of belt 7 used for transport of components" refers to a region of the belt 7 extending from component delivery position X1 to component stop position X2.

The third attracting section M3 comprises a plurality of rare-earth permanent magnets each having a disk-like shape. The magnets are equally spaced apart from one another at the center in width of the guide groove 6a along the component transport direction. These magnets are implanted in belt guide 6 so that the upper surface of each magnet coincides with or is slightly below the bottom surface of the guide groove 6a. The magnets have opposite vertically polarized faces, with the polarization of adjacent magnets along the length of belt 7 being reversed.

Below the component take-out position X3, where the foremost chip component P is forwardly displaced by stopper 9 (as shown in FIGS. 7 and 8), the bottom surface of the guide groove 6a has a second attracting section M2 for retaining chip components; section M2 also includes disk-like rare-earth permanent magnets having opposite vertically polarized faces. Between second attracting section M2 and third attracting section M3 is a gap corresponding to the length of one chip component P. See FIG. 8.

Furthermore, in the first embodiment as hitherto described, the permanent magnets used in the second and third attracting sections M2 and M3 each have a diameter larger than the longitudinal dimension of chip component P. The magnetic polarities of the sides of the magnets of the third attracting section M3 confronting the belt 7 are arranged in such a manner that their respective north and south poles alternate in sequence from the foremost permanent magnet.

The polarity, e.g., a south pole, of the side confronting the belt 7 of the single permanent magnet constituting the second attracting section M2 differs from the polarity, e.g., north pole, of the side confronting the foremost chip component P of the single permanent magnet of first attracting section M1 (to be described in detail later). The attracting magnetic force exerted by the first attracting section M1 on the foremost chip component P displaced to the take-out position X3 is smaller than the attracting magnetic force exerted by the second attracting section M2 on the same chip component P so that the chip component has a tendency to remain at position X2.

As shown in FIG. 3, 8, 12, and 14, belt 7 comprises a non-magnetic, flat, belt preferably made of synthetic rubber, flexible resin, or the like. Belt 7 is wound on a pair of pulleys 8 rotatably supported by frame 1 at positions anterior and posterior to the belt. The upper side of the belt 7 is located within the guide groove 6a of the belt guide 6 and is urged by a winding tension into movable contact with the bottom surface of component guide 5.

As shown in FIGS. 8, 9(a), 9(b) and 14, stopper 9 comprises a non-magnetic rectangular plate having a thickness approximately equal to the height of passage 5a through which components P are fed. Stopper 9 has one end supported at the anterior position of the passage 5a on a stopper support member by a pin 9a (FIG. 14) so the stopper is freely horizontally movable. Stopper 9 is urged by a coiled spring S3 in the counterclockwise direction, as shown in FIG. 14. Stopper 9 is at a desired component stop position when the stopper forward surface abuts the front end of passage 5a. See FIG. 15.

The first attracting section M1, which stops component displacement, is located where the stopper 9 confronts the foremost chip component P. See FIG. 16(c). First attracting section M1 comprises a prism-like rare-earth permanent magnet normally positioned so that its north pole surface abuts the foremost chip component P. In a first embodiment, the single permanent magnet constituting the first attracting section M1 has a height substantially equal to the height of the chip component P and a width larger than the width dimension of the same chip component P. Alternatively, the permanent magnet has a height smaller than the height of the chip component P and a width smaller than the width of the chip component P.

Abutting the upper face of the permanent magnet of the first attracting section M1 is a substantially semi-circular high magnetic permeability (preferably iron) disk J. Disc J has a greater surface area than the top surface area of the permanent magnet of first attracting section M1 and extends into a recess of a non-magnetic jamb of stopper 9. The surface of disc J coincides with the top surface of the jamb of stopper 9. See FIG. 16(c). Magnetic disk J is movable to adjust the magnetic field of the first attracting section M1. Disk J suppresses the upward magnetic biasing force of the permanent magnet of first attracting section M1 to shift the center of the magnetic field derived from section M1, where the magnetic force of the field is greatest. The center of the field is shifted to the portion of the confronting side of the foremost chip component P between the center and the top of the chip component.

In the first embodiment a stopper support member 9b (FIGS. 14 and 15) for rotatably supporting the stopper 9 is mounted by a pin 9c at one end of the front part of the component guide 5 so the stopper can turn upwardly. This facilitates discharge of the chip components P from passage 5a. More specifically, the face of stopper support member 9b remote from guide 5 is engaged by a plate spring 9d, A located at the front end of component guide 5 so the plate spring is maintained in a horizontal state. Stopper support 9b is selectively released from plate spring 9d to allow the stopper support member 9b to turn upwardly to become separated from the belt 7. Thus, stopper 9 moves upwardly away from belt 7 in response to upward movement of stopper support member 9b, so a chip component P is discharged from the open exterior end of passage 5a.

As best seen in FIG. 3, pipe raising/lowering mechanism 10 comprises an operating lever 10a, a relay lever 10b arranged below lever 10a, and a positioning stopper 10c for restricting the return of operating lever 10a. One end of operating lever 10a is rotatably supported in turn by horizontally extending pin 10d fixedly mounted on the frame 1. In its standby mode the middle of the upper surface of lever 10a abuts positioning stopper 10c. Relay lever 10b is rotatably supported near its center by horizontally extending pin 10e fixedly mounted on frame 1, allowing turning of relay lever 10b in a vertical plane. The right end of relay lever 10b (as seen in FIG. 3) has a circular hole or a U-shaped portion interposed between the lower end jaw 4c of the movable pipe 4 and the lower coil spring S2. Lever 10b is urged downward in its standby mode by upper coiled spring S1 and lower coiled spring S2, whereby roller 10f at the other end of lever 10b abuts the middle bottom surface of operating lever 10a at a point further from pin 10d than the engagement point of stopper 10c.

The positioning stopper 10c comprises a disk and screw for releasably securing the disk at an eccentric position.

Varying the orientation at which the disk is secured enables the return position of operating lever 10a to be optionally adjusted to control lowest position of movable pipe 4. For example, by moving positioning stopper 10c to a position indicated by a broken line in FIG. 3, the return position of operation lever 10a shifts to the lower side of the position shown by a solid line, to displace upwardly the lowest position of the movable pipe 4.

Figure 5:
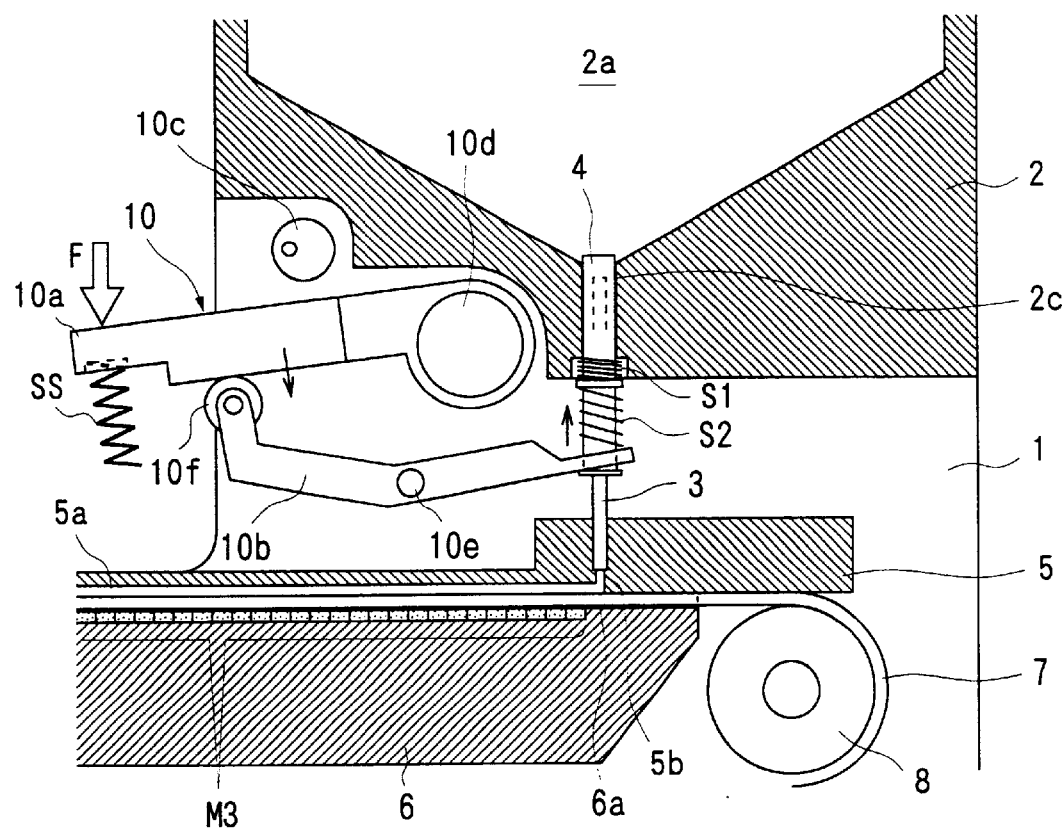
FIG. 5 is a sectional view to explain the operation of the pipe raising/lowering mechanism per FIG. 3.

In this pipe raising/lowering mechanism 10, as best seen in FIG. 5, a downward pressing force F is applied to the end portion of the operation lever 10a, to rotate operation lever 10a counterclockwise around the pin 10d. Force F causes the bottom surface of operation lever 10a to apply a downward force to roller 10f, to cause relay lever 10b to turn counterclockwise around pin 10e to drive coiled spring S2 upwardly, and move movable pipe 4 upwardly against compressing coiled spring S1.

When the force F is released from the end of the operation lever 10a, movable pipe 4 moves downwardly by the biasing force of coiled spring S1, which is followed by clockwise rotation of relay lever 10b. Then, the upward push by roller 10f rotates operation lever 10a clockwise. When lever 10a abuts stopper 10c, operation lever 10a stops turning and returns to its standby mode illustrated in FIG. 3.

Figure 10:
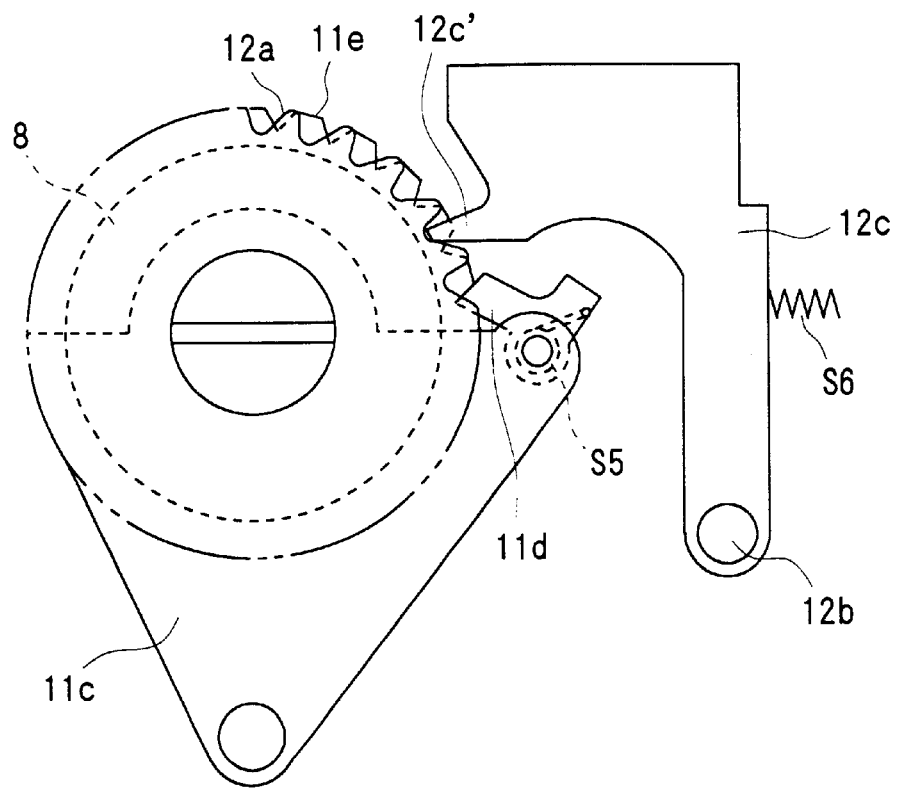
FIG. 10 is a detailed view of a front side pulley portion.
Figure 11:
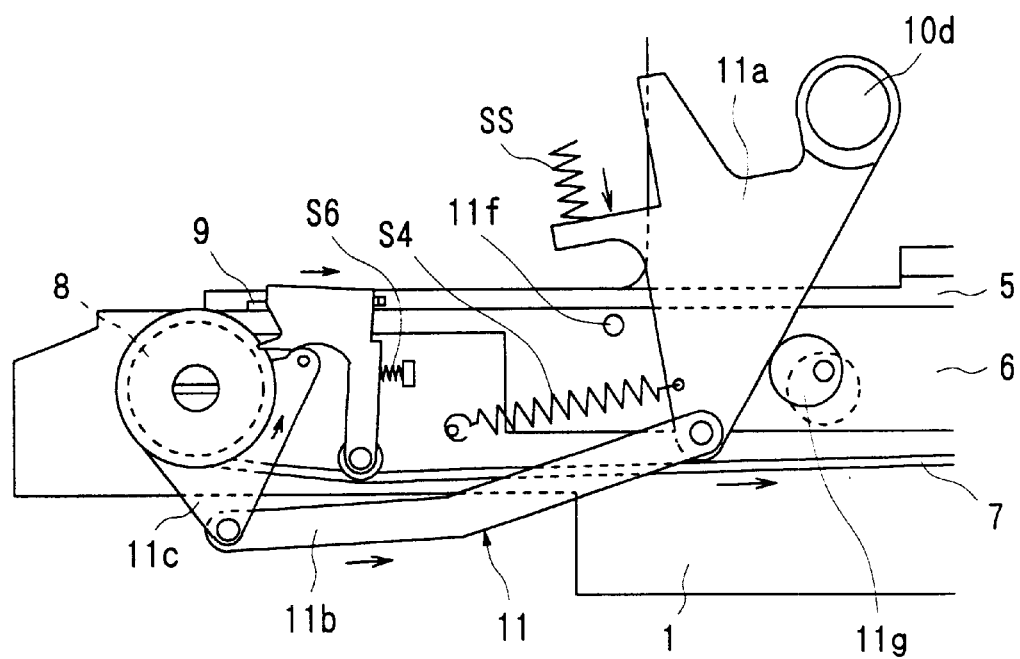
FIG. 11 is an explanatory view of a belt driving mechanism.

As shown in FIGS. 10 and 11, the belt driving mechanism 11 comprises an operation lever 11a, a relay lever 11b coupled to lever 11a in a freely rotatable manner, a delivery lever 11c coupled to lever 11b in a freely rotatable manner (lever 11c is also coaxially rotatable with the front pulley 8), a ratchet 11d rotatably mounted on delivery lever 11c, a ratchet wheel 11e fixedly coaxially mounted on front pulley 8, a positioning stopper 11f for restraining the return position of operation lever 11a, a positioning stopper 11g for restraining the rotation limit position of operating lever 11a, a coil tension spring S4 for urging operation lever 11a in the clockwise direction, and a wound compression spring S5 which forces the ratchet 11d into contact with ratchet wheel 11e. One end of operation lever 11a is rotatably supported by the horizontally extending pin 10d common to the pipe raising/lowering mechanism 10 to allow rotation of lever 11a in a vertical plane. In the standby mode of belt drive mechanism 11, the side middle portion of lever 11a is urged by tension spring S4 against positioning stopper 11f.

Operation lever 11a of belt driving mechanism 11 and operation lever 10a of pipe raising/lowering mechanism 10 are arranged such that their respective operational portions vertically confront each other by way of coiled compression spring SS (FIG. 11). The downward pressing force F applied to the end of operation lever 10a of the pipe raising/lowering mechanism is thereby transmitted via coiled spring SS to the end of the operation lever 11a of the belt driving mechanism 11.

Positioning stopper 11g, like the above-described positioning stopper 10c, comprises a disk and a screw for securing the disk at its eccentric position, so that by varying the orientation in which the disk is secured it is possible to optionally adjust the rotation limit position of the operation lever 11a, i.e., the amount of delivery of the belt 7. For example, positioning stopper 11g can be shifted to the position indicated by a broken line in FIG. 1 to allow the rotation limit position of operation lever 11a to shift rightward from the position shown by a solid line to increase the belt driving force.

The downward force F applied to the end of the operation lever 10a of the pipe raising/lowering mechanism 10 is transmitted via coiled spring SS to the end of the operation lever 11a of belt driving mechanism 11. The result is that (as shown in FIG. 11) operation lever 11a is rotated in the counterclockwise direction around pin 10d against the biasing force of the coiled tension spring S4 to drive the delivery lever 11c in the counterclockwise direction via the relay lever 11b. Simultaneously, ratchet wheel 11e (FIG. 10) engages ratchet 11d of delivery lever 11c to rotate the ratchet wheel in the counterclockwise direction. Rotation of ratchet wheel 11e drives front side pulley 8, to translate belt 7 forward by a distance corresponding to the rotational angle between adjacent teeth of wheel 11e.

Furthermore, the pressing force F applied to the end of the operation lever 10a of the pipe raising/lowering mechanism 10 is released to the state shown in FIG. 11 to release the pressing force against the end of the operation lever 11a. Operation lever 11a is then rotated clockwise by the biasing force of coiled spring S4 to abut positioning stopper 11f, to stop turning of operation lever 11a and return relay lever 11b and delivery lever 11c to the standby mode per FIG. 1. At the same time, ratchet 11d of delivery lever 11c is driven clockwise to engage the next groove of ratchet wheel 11e.

The stopper displacement mechanism 12, as shown in FIGS. 10 and 14, comprises a ratchet wheel 12a fixedly coaxially mounted to the front side of pulley 8, a stopper operation plate 12c rotatably mounted on horizontally extending pin 12b so the plate slides on the side surface of the frame 1, a coiled compression spring S6 for urging stopper operation plate 12c forward to bring a protrusion 12c' thereof into pressing contact with the grooves between the teeth of ratchet wheel 12a, a component retainer lever 12e (FIG. 14) rotatably mounted on horizontally extending pin 12d (carried by the front part of component guide 5), a coil compression spring S7 for urging component retainer lever 12e clockwise as seen in FIG. 14, a component retainer pin 12f inserted into a hole formed in the front side (exit) surface of passage 5a, and a coiled tension spring S8 for urging the component retainer pin 12f out from passage 5a.

In the standby state in which the stopper operation plate 12 is located in its front position abutting stopper 9, as shown in FIG. 14, a component retainer lever 12e is urged by coiled spring S7 in a clockwise direction, whereby a component retainer pin 12f is pushed into passage 5a against the urging force of coiled tension spring S8. This causes the second foremost chip component P to be pressed against the inner upper surface of the passage 5a and retained at this position. Stopper operation plate 12c then displaces stopper 9 forward to the component take-out position X3 (FIG. 8). Position X3 is spaced forwardly of the component stop position X2. The result is that the foremost chip component P and the stopper 9 are displaced forward and the foremost chip component remains attached by the magnetic attracting force of the first attracting section M1 to the stopper, to separate the foremost chip component P from the succeeding chip components.

Figure 15:
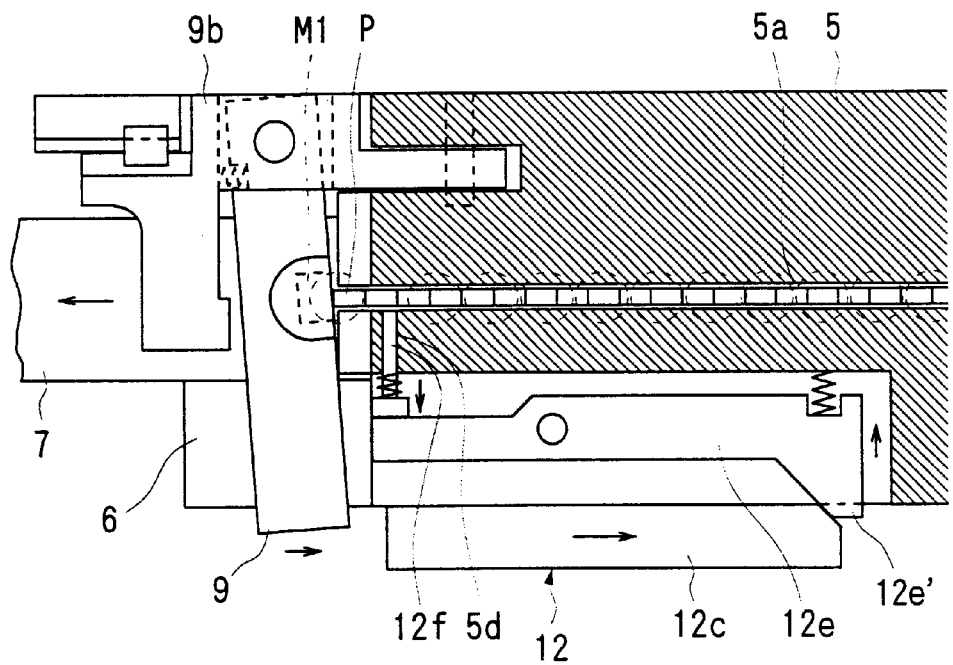
FIG. 15 is a partially sectioned view to explain the action of the stopper displacement mechanism.

The stopper operation plate 12c of stopper displacement mechanism 12 is moved backward by a predetermined distance by utilizing the raised portion corresponding to one ratchet tooth of the ratchet wheel 12a because the ratchet wheel 12a rotates with the ratchet wheel 10 of the belt driving mechanism 11 described earlier. See FIG. 10. When the stopper operation plate 12c is moved backward, as shown in FIG. 15, the biasing force of coiled spring S3 drives stopper 9 against the front end of the passage 5a to secure the component stop position. Simultaneously, the rear end protrusion 12e' of component retainer lever 12e is pushed inward by stopper operation plate 12c against the urging force of the component retainer lever 12e, to rotate the lever 12e counterclockwise, as shown in FIG. 15. The component retainer pin 12f is moved out of passage 5a by the urging force of coiled tension spring S8 to release the second foremost chip component P from the ceiling of passage 5a to allow additional aligned transportation of the chip components within passage 5a.

A description is now provided of the operation of the chip component feeding apparatus shown in FIGS. 1 to 15.

Upon removal of the foremost chip component P from the component take-out port 5c by means of an attracting nozzle (not shown) or the like, the left end portion of operation lever 10a of the pipe raising/lowering mechanism 10 (as seen in FIG. 3) is pressed downward by a part of the attracting nozzle or other driving device.

In the state in which movable pipe 4 is at its lower position, as shown in FIG. 4, an annular pocket E is defined by adjacent portions of the upper end of moveable pipe 4, the inner surface of the sliding hole 2c, and the outer surface of the fixed pipe 3, so a few components P are in annular pocket E.

When the left end portion of operation lever 10a of the pipe raising/lowering mechanism 10 (as seen in FIG. 3) is pressed downward, as described above, movable pipe 4 is raised by a predetermined stroke from its lower position by rotation of the operation lever 10a and corresponding rotation of the relay lever 10b, and the upper end of movable pipe 4 is received within the accommodation chamber 2a of the hopper 2.

Figure 6:
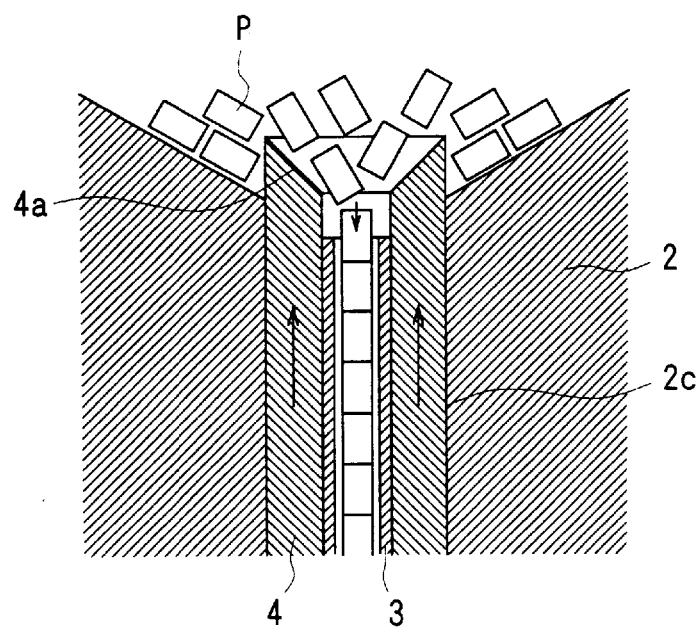
FIG. 6 is a detailed view showing the movable pipe in its raised position.

In the process in which the movable pipe 4 is moved from its lower position to the raised position as best seen in FIG. 6, those chip components P which were within the annular pocket E are raised upward by the movable pipe 4 and the other chip components located within the accommodation chamber 2a are moved from their rest positions. The chip components P lying on the fixed pipe 3 are pushed away from their initial positions. In the same process, the chip components P within the hopper 2 are taken one by one in their longitudinal directions into the upper end opening of fixed pipe 3, being guided by the inclination of the upper end guide surface 4a of the movable pipe 4. The chip components P in the fixed pipe 3 drop by gravity through the interior of the fixed pipe 3 with the same orientation.

When the pressing force F against the end portion of the operation lever 10a of the pipe raising/lowering mechanism is released, as described earlier, the relay lever 10b and the operation lever 10a are rotated by spring biasing forces. The same spring biasing forces drive movable pipe 4 downwardly back to the lower position from the raised position.

When movable pipe 4 is moved from its raised position to its lowered position as best seen in FIG. 4, a few chip components P again enter the interior of the annular pocket E, to generally allow all the other chip components in chamber 2a to descend. The inclination of the upper end guide surface 4a of the movable pipe 4 guides more of the chip components P into the upper end opening of fixed pipe 3 one by one in their longitudinal directions. The components are then dropped by gravity through the interior of the pipe 3 with the same orientation.

In this manner, the dispensing of more and more chip components into the interior of the fixed pipe 3 is performed by repetitively raising and lowering movable pipe 4. The chip components P enter and then drop by gravity through the interior of the vertical passage 5b, and finally end up at the component delivery position X1 on belt 7. See FIG. 12.

On the other hand, when a downward force F is applied to the end of operation lever 10a of the pipe raising/lowering mechanism 10, as described above, the end of operation lever 11a of the belt driving mechanism is pressed downward by the coiled spring SS. As a result, relay lever 11b and the delivery lever 11c turn to cause counterclockwise rotation of the ratchet wheel 1e. Since ratchet 11d engages wheel 11e and front side pulley 8, the counterclockwise rotation of wheel 11e drives the front side pulley 8 and belt 7, so the belt moves forward by a distance corresponding to the rotation of pulley 8. Preferably the forward motion of belt 7 is through a distance slightly greater than the longitudinal dimension of one chip component P.

In the process in which the belt 7 moves intermittently forward by a predetermined distance associated with the length of a chip component, another chip component P has dropped by gravity through the vertical passage 5b so its lower end abuts belt 7 and is pulled forward by its friction with the belt and is turned over onto the belt, followed by abutment of the subsequent chip component P against the top surface of the belt. (See FIG. 13.)

This intermittent movement of the belt 7 is repeated each time the foremost chip component P is removed from the component take-out port 5c, causing the chip components P stacked in the fixed pipe 3 and the vertical passage 5b to move in sequence while being subjected to the same turnover function. Consequently, a plurality of chip components P are aligned in the longitudinal direction within the passage 5a and are translated forward in this aligned state in unison with the intermittent movement of the belt 7.

As discussed earlier, since the third attracting section M3 includes a plurality of permanent magnets arranged below the region of belt 7 where the components are translated, the component P transported forward by the belt 7 is attracted downward by the magnetic force of the third attracting section M3 and remains in contact with the belt surface while being translated. Furthermore, since the polarities of the permanent magnets constituting the third attracting section M3 in alternate along the length of belt 7, the above-described contact is ensured irrespective of the positions of the chip components P while they are in the component transport region of belt 7.

Accordingly, even though friction with passage 5a is experienced by the chip components P in the transport process, any floating around or inclination of the components P is positively prevented, thus ensuring that the aligned state of the translated chip components is maintained. Also, because there are no permanent magnets below the component delivery position X1 of belt 7, magnetic force does not impede delivery of dropped chip components from the vertical passage 5b onto the belt 7, nor does it affect the component turnover function performed by belt 7 as discussed earlier.

On the other hand, when ratchet wheel 11e of belt driving mechanism 11 rotates with front side pulley 8 to move belt 7 forward, the ratchet wheel 12a of the stopper displacement mechanism 12 which rotates in the same direction as the ratchet wheel causes the stopper operation plate 12c to retreat by a predetermined distance. Stopper 9 is displaced backward by the spring biasing force, resulting in stopper 9 abutting the front end of passage 5a to secure a desired component stop position. The chip components P transported in alignment as a result of the movement of belt 7 are stopped by abutting the stopper 9, so they are aligned without any gap in the longitudinal direction with the foremost chip component P abutting the stopper 9. Furthermore, since the amount of intermittent movement of the belt 7 is set so as to be slightly larger than the longitudinal dimension of the chip components P, belt 7 only advances slightly while sliding with respect to the component contact surfaces even after the translated aligned chip components P have been stopped by the stopper 9. See FIG. 15.

After the ratchet wheel 12a of the stopper displacement mechanism 12 rotates by a predetermined angle (corresponding to one ratchet tooth) with the ratchet wheel 11e of the belt driving mechanism, the stopper operation plate 12c is rotationally returned as previously discussed. As seen in FIG. 14, the rotational return of the component retainer lever 12c then causes the extremity of component retainer pin 12f to protrude into the passage 5a to hold the second foremost chip component P against the ceiling of passage 5a. Simultaneously with this, stopper 9 is displaced forward so it is spaced against the ceiling of passage 5a from the front end of the passage 5a, while the foremost chip component P is attracted to stopper 9 by the magnetic force of the first attracting section M1. Foremost component P and stopper 9 are moved to component take-out position X3 and the foremost component is separated from the succeeding chip components P. Consequently, a gap C is always formed between the foremost chip component P and the succeeding chip components P.

Because a gap corresponding to at least the length of one component (see FIG. 8) is between the second attracting section M2 (located below the component take-out position X3 of belt 7) and the third attracting section M3 (located behind the second attracting section M2), the various magnetic forces do not impede the separation of the foremost chip component P caused by forward displacement of the stopper 9 and the holding or retaining in place of the second chip component P by component retainer pin 12f.

In the state where the stopper is forwardly displaced and the foremost chip component P is completely separated from the succeeding chip components P, as seen in FIG. 8, the foremost chip component P is positioned just above the underlying second attracting section M2 at a position where the longitudinal center of the chip component P coincides with the longitudinal center of the single permanent magnet constituting the second attracting section M2, or at a position where the longitudinal center of the chip component P is slightly posterior to the longitudinal center of the permanent magnet. This causes the chip component P to lie within the magnetic field formed between the first attracting section M1 and the second attracting section M2.

More specifically, the foremost chip component P attracted to the stopper 9 by the magnetic force of the first attracting section M1, is translated to the component take-out position and is attracted downwardly by the magnetic force of the underlying second attracting section M2 and is brought to its intended contact with the top surface of the belt 7. Thus, the foremost chip component P translated to the component take-out position X3 is retained at a stabilized posture at the component take-out position X3 by the attracting forces of the first and second magnetic attracting sections M1 and M2, and the proper posture of the chip component is maintained until the component is removed by an attracting nozzle or the like.

Moreover, the attracting force acting on the foremost chip component P which has been translated from the first attracting section M1 to the component take-out position X3 is smaller than the attracting force of second attracting section M2 acting on the same chip component P, so that the foremost chip component P attracted to stopper 9 is securely brought into intimate contact with the top surface of the belt 7 to prevent the component from floating.

Moreover, the magnetic polarity of the first attracting section M1 side confronting the foremost chip component P differs from the magnetic polarity of the side confronting the same component of the second attracting section M2, so that the magnetic forces of the attracting sections M1 and M2 ensure effective performance of the component retaining functions.

Also, translatable magnetic plate J for adjusting the magnetic field above or below the first attracting section M1 suppresses magnetic flux leakage directed upwardly or downwardly relative to the first attracting section M1. By shifting the position of plate J so there is a stronger magnetic force on the upper side or lower confronting side of the foremost chip component P in the component height direction, raising or inclining of the foremost chip component P is to a large extent prevented when the component is attracted to the stopper 9. In other words, changing the position of plate J enables the center of the magnetic field of section M1 to be coincident with the portion along the length (i.e., height) of the foremost component, causing the foremost component position to be stabilized while it is attracted to stopper 9.

Furthermore, since the length of the single permanent magnet constituting the second attracting section M in the component transport direction is greater than the longitudinal dimension (i.e., length) of the chip component P, the magnetic force from the second attracting section M2 acts securely on the chip component P at the component take-out position.

The take-out of the foremost chip component P by an attracting nozzle or the like is carried out, as shown in FIGS. 8 and 14, at a position where the stopper 9 and foremost chip component P are displaced to the component take-out position X3. At this point, the foremost component is spaced from the succeeding chip components P and the chip component P, displaced to the component take-out position X3, is retained at position X3 by the attracting forces of the first and second attracting sections M1 and M2. The result is that the foremost chip component and the immediately succeeding component which might have become attached to each other or entangled due to the influence of moisture or the like are readily released from each other, and the foremost chip component is removed with its posture stabilized without interfering with the succeeding chip component.

FIGS. 16(a), 16(b) and 16(c) are illustrations of a variant of the stopper which differs from the stopper shown in FIGS. 1 to 15 in that the first attracting section M1 and the magnetic plate J are slightly retracted from the surface confronting the passage 5a and in that the side confronting the foremost chip component P of the first attracting section M1 is covered with a low-magnetic or non-magnetic plate H. This enables the attracting force of the first attracting section M1 covering the foremost chip component P to be controlled by the plate thickness "t" of the non-magnetic plate H, which is effective when the component attracting force of stopper 9 is varied according to the shape and dimensions of the chip component P.

Figure 16:
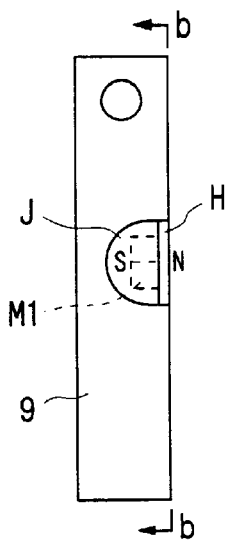
FIGS. 16(*a*) to 16(*c*) are diagrams each showing a respective variant of the stopper.
Figure 16:
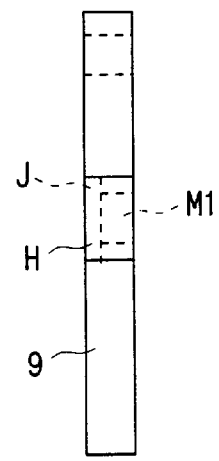
Figure 16:
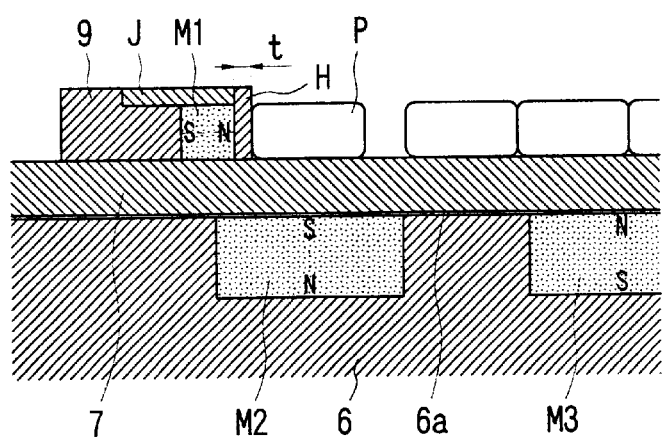
Figure 17:
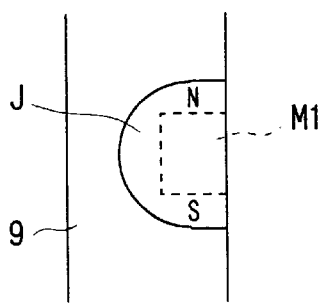
FIGS. 17(*a*) and 17(*b*) are diagrams each showing other variants of the stopper.
Figure 17:
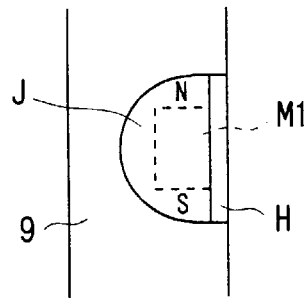

FIGS. 17(a) and 17(b) are illustrations of another variant of the stopper which differs from the stopper shown in FIGS. 1 to 15, and from the stopper shown in FIGS. 16(a), 16(b) and 16(c), in that the first attracting section (permanent magnet) M1 is arranged such that its surface having no polarity confronts the foremost chip component. In other words, the permanent magnet of M1 is arranged such that its "north" and "south" poles are located on both end surfaces adjacent the surface confronting the foremost chip component P. This enables the magnetic force of M1 to be readily controlled by the orientation of its permanent magnet, which is effective when the magnetic force of the first attracting section (permanent magnet) M1 covering the foremost chip component P is reduced.

Figure 18:
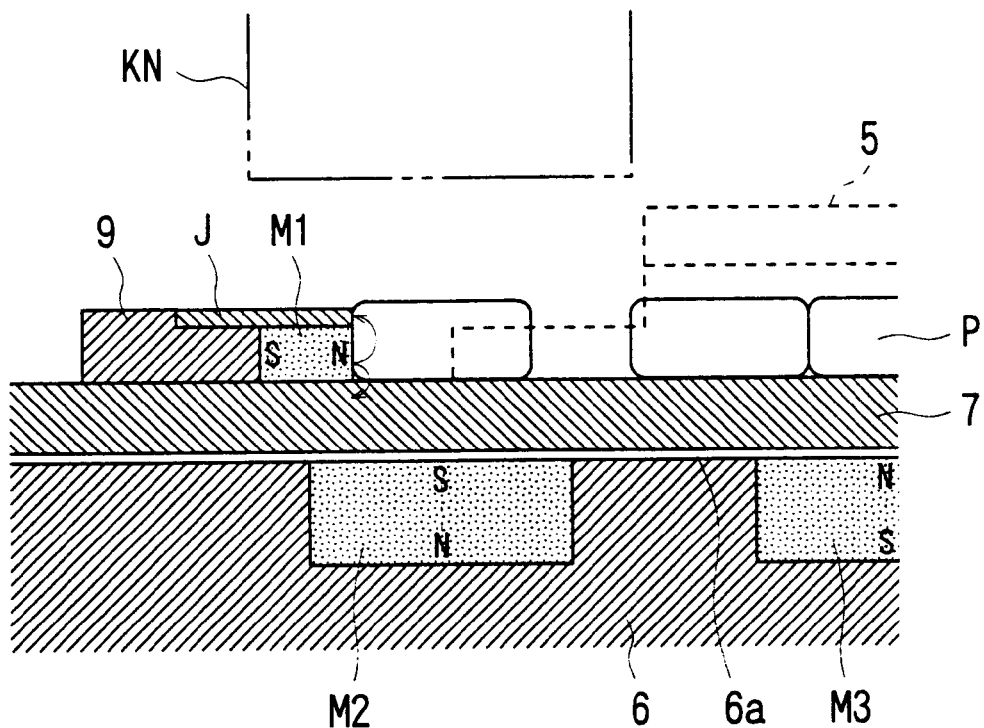
FIG. 18 is a diagram showing a further variant of the stopper.

FIG. 18 is an illustration of a further variant of a stopper which differs from the stopper shown in FIGS. 1 to 15 in that the thickness dimensions (in this embodiment, the sum of the thickness of the first attracting section M1 and the thickness of the magnetic plate J) of the stopper 9 is no more than the height of the chip component P. This prevents a situation in which stopper 9 interferes with the attracting nozzle KN or blocks attraction of the components thereby when the foremost chip component P is displaced to the component take-out position and is taken out by the attracting nozzle KN. When the attracting nozzle KN has a large contour the thickness of stopper 9 can not be more than the height of the chip component P. Consequently, a notch (indicated by a broken line in FIG. 18) is preferably disposed at the front end of component guide 5 to avoid interference with the attracting nozzle KN.

Figure 19:
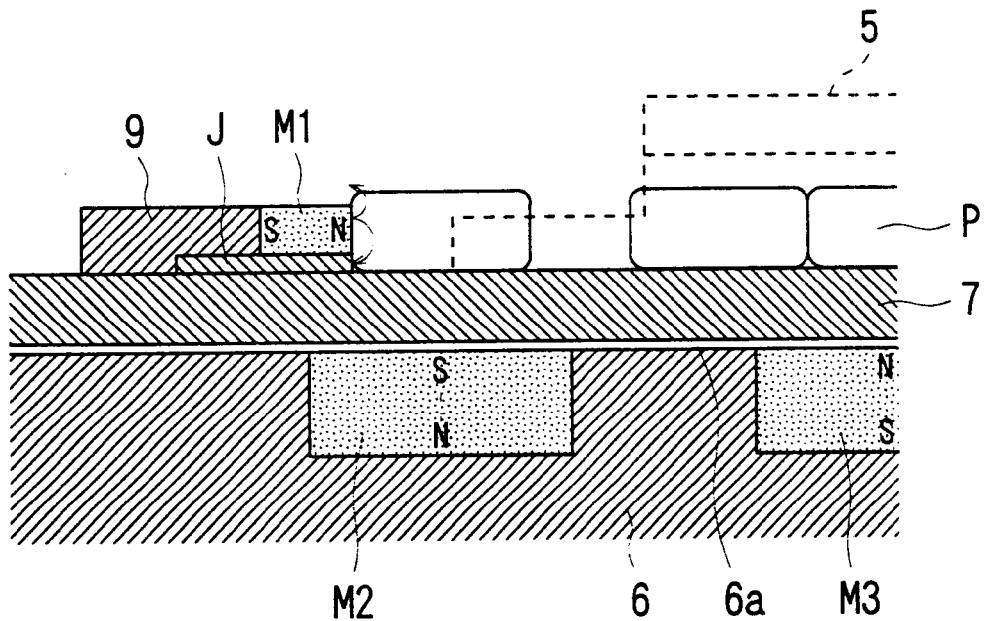
FIG. 19 is a diagram showing a further variant of the stopper.

FIG. 19 relates to yet another variant of the stopper which differs from the stopper shown in FIG. 18 in that a substantially semi-circular magnetic plate J larger than the bottom surface of the first attracting section M1 is located below the permanent magnet of M1 such that the bottom surface of the magnetic plate J coincides with the bottom surface of stopper 9. This causes magnetic plate J, provided below the first attracting section M1, to shift the portion having a stronger magnetic force of the side confronting the foremost chip component P of the first attracting section M1 to the lower side of its center in a height direction, thereby pressing the foremost chip component P attracted to the stopper 9 against the top surface of the belt 7 to ensure a more secure intimate contact of the component with the belt 7. Other functions and effects are the same as those of the stopper shown in FIG. 18.

Figure 20:
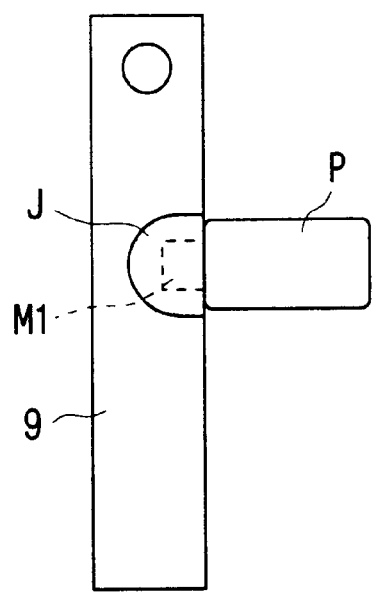
FIGS. 20(a) and 20(b) are diagrams each showing other variants of the stopper.
Figure 20:
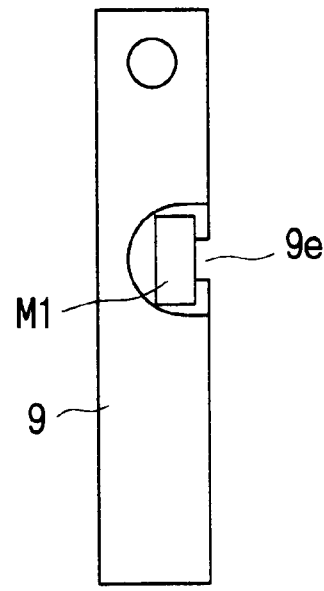

FIGS. 20(a) and 20(b) are illustrations of a still further variant of the stopper. The stopper shown in FIG. 20(a) differs from the stopper shown in FIGS. 1 to 15 in that the width of the first attracting section (permanent magnet) M1 is smaller than the width of the chip component P to be fed. The stopper shown in FIG. 20(b) differs from the stopper shown in FIGS. 1 to 15 because (1) the first attracting section (permanent magnet) M1 is positioned inside the surface confronting the foremost chip components P of the stopper 9 and (2) notch 9e in stopper 9 causes the exposed width of the permanent magnet to be smaller than the width of the chip component P to be fed. The stoppers shown in FIGS. 20(a) and 20(b) have the advantage that since the width of the magnetic flux passage region of the first attracting section M1 is smaller than the width of the chip component P to be fed, the foremost chip component P is prevented from deviating from the region having a strong magnetic force to ensure an appropriate execution of the attraction of the chip component P onto the stopper 9, even though the position of the foremost chip component P has been offset in the width direction.

It is to be appreciated that although in FIGS. 20(a) and 20(b) the width of the magnetic flux passage region (attraction effective region) on the side confronting the foremost chip component P of the first attracting section M1 is restricted by the dimension/size or exposed area of the first attracting area, the width dimensions may be restricted in other ways.

Figure 21:
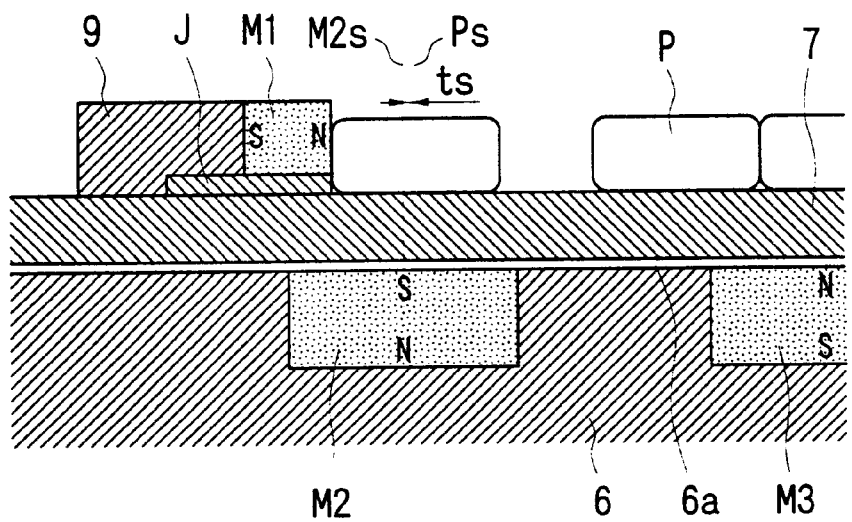
FIG. 21 is a diagram showing a variant of a second attracting section.

FIG. 21 is an illustration of a variant of the second attracting section which differs from the second attracting section shown in FIGS. 1 to 15 in that the center M2s in the component transport direction of the permanent magnet constituting the second attracting section M2 lies slightly forward of the center Ps in the component transport direction of the foremost chip component P displaced to the component take-out position. The foremost chip component P displaced to the component take-out position lies in a magnetic field formed between the first and second attracting sections M1 and M2, and the magnetic flux density at that point is not uniform relative to the center Ps of the chip component P; the magnetic flux density on the side closer to the stopper 9 is higher than on the opposite side. This eliminates a deviation of the attracting forces of both the attracting sections M1 and M2 covering the chip component P, thus ensuring increased retention of the posture of the chip component P that is displaced to the component take-out position.

Figure 22:
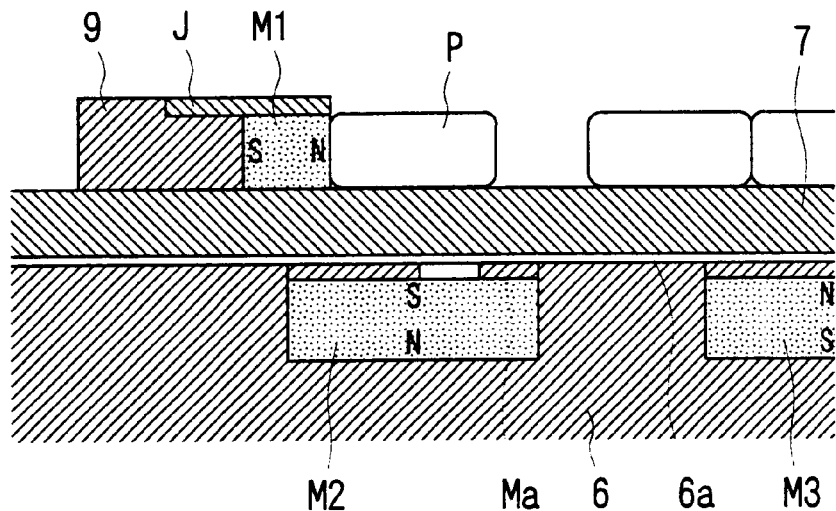
FIG. 22 is a diagram showing another variant of the second attracting section.

FIG. 22, an illustration of another variant of the second attracting section, differs from the second attracting section shown in FIGS. 1 to 15 in that (1) the second attracting section (permanent magnet) M2 is positioned below the bottom surface of the guide groove 6a and (2) the top surface of the second attracting section M1 is covered with a non-magnetic mask plate Ma so that the exposed portion of the second attracting section M2 is positioned posterior to the center (in the component transport direction) of the chip component P displaced to the component take-out position. This eliminates the deviation of the attracting force of both the attracting sections M1 and M2 covering the chip component P, in the same manner as FIG. 21, without varying (1) the component take-out position or (2) the size or position of the second attracting section M2, thereby ensuring increased retention of the posture of the chip component P displaced to the component takeout position.

It is to be appreciated that although in FIGS. 21 and 22 the positional relationship between the center of the magnetic flux passage region (attracting effective region) of the second attraction section M2 and the foremost chip component is defined by the position of the second attracting section M2 or the position of the exposed portion, other methods may be employed to define this positional relationship.

Figure 23:
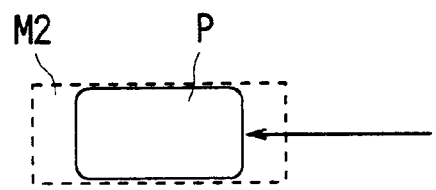
FIG. 23 is a diagram showing another variant of the second attracting section.

FIG. 23 is an illustration of another variant of the second attracting section, which differs from the second attracting section shown in FIGS. 1 to 15 because (1) a prism-like permanent magnet is used as a permanent magnet constituting the second attracting section and (2) in that the width of the permanent magnet is approximated to the width of the chip component P to be fed. This arrangement allows the magnetic force of the second attracting section M2 to act effectively on the foremost chip component P displaced to the component stop position, thereby preventing the magnetic force from reaching an area other than the chip component P at the same position, to prevent any component deviation.

It is to be appreciated that although in FIG. 23 the width of the magnetic flux passage region (attracting effective region) on the side confronting the foremost chip component P of the second attracting section M2 is defined by the size of the second attracting section M2 it may also be defined by the exposed area of the second attracting section M2 as FIG. 20(b) or in other possible ways.

Figure 24:
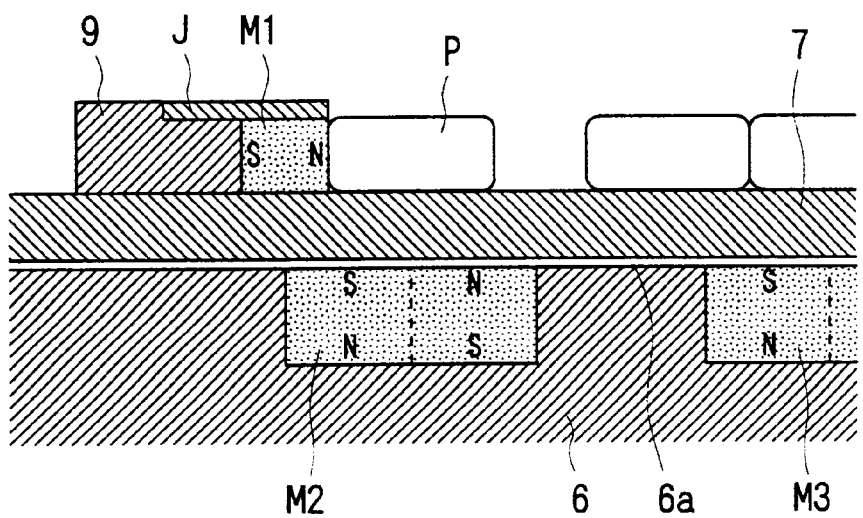
FIG. 24 is a diagram showing a further variant of the second attracting section.

FIG. 24 is an illustration of still another variant of the second attracting section which differs from the second attracting section shown in FIGS. 1 to 15 because the permanent magnet constituting the second attracting section M2 is a bipolar magnet having both its "north" and "south"

poles on the longitudinal surface along the component transport direction. In this arrangement, the polarity of the top surface of the bi-polar magnet closest to the stopper differs from the polarity of the magnet side confronting the foremost chip component P of the first attracting section, thus providing the same retaining posture as provided in the embodiment of FIGS. 1 to 15. The same types of bi-polar magnet are used for each of the permanent X magnets constituting the third attracting section M3.

It will be appreciated that when the foremost chip component P is attracted in direct abutment with the permanent magnet or magnetic plate of the stopper, as in the above-described stopper structure, an entanglement can occur when the foremost chip component displaced to the component take-out position is taken out if the surface frictional resistance of the permanent magnets and the magnetic plate is excessively high. In such a case, a smoothing treatment is preferably provided on a region of the permanent magnet and the magnetic plate against which at least the foremost chip component P abuts. The smoothing treatment can involve abrading or etching the region to provide a smoothed portion or a coating, such as fluorine resin, can be applied to the region to provide a similar smoothed surface. These measures eliminate inconveniences, such as the presence of forwardly inclined chip component P or defective take-out because the surface frictional resistance, even when the foremost chip component P displaced to the component take-out position is taken out by the attraction by the attracting nozzle or the like. These measures ensure better unloading of the foremost chip component P displaced to the component take-out position with its proper posture.

In the case where the foremost chip component P is brought into direct abutment with the non-magnetic plate H for the attraction onto the stopper, per the stopper structure of FIG. 16, the non-magnetic plate H is preferably formed from a material having a low frictional coefficient, or the same smoothed region as described above is provided in the region of the non-magnetic plate H against which at least the foremost chip component P abuts.

Figure 25:
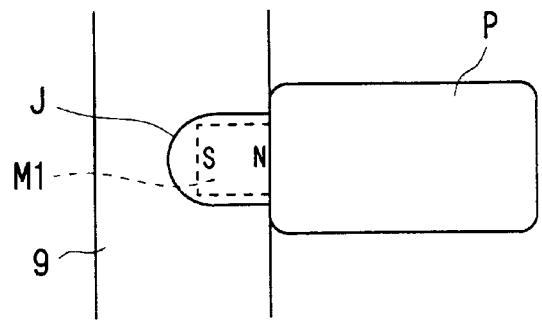
FIG. 25 is a diagram showing a further variant of a stopper.

FIG. 25 is an illustration of still another variant which differs from the stopper shown in FIGS. 1 to 15 in that the widths of (1) the first attracting section (permanent magnet) M1 confronting the foremost chip component P and (2) the magnetic plate J confronting the foremost chip component P are set to be smaller than the width of the chip component P, thereby making the contract area between the two as small as possible. This variant enables the frictional resistance between the first attracting section M1, the magnetic plate J and the chip component P to be reduced without any smoothed portion as described above, thus ensuring a better unloading of the foremost chip component P displaced to the component take-out position in its proper posture.

Figure 26:
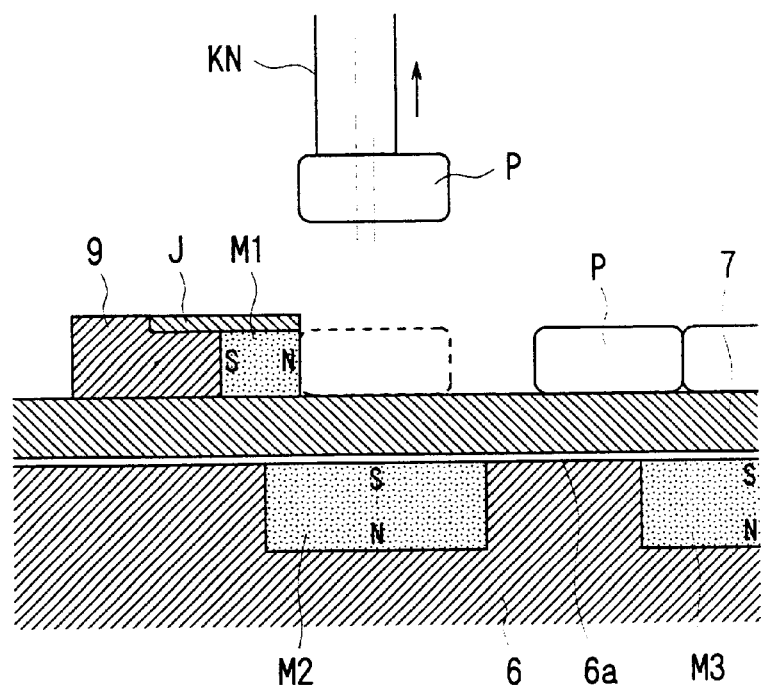
FIG. 26 is a diagram showing one variant of an attracting position relative to the take-out of the chip component.

FIG. 26 is an illustration of a variant of the attracting position when the foremost chip component is being taken out, which differs from that shown in FIGS. 1 to 15 in that the attracting nozzle KN attracts the foremost chip component at a point closer to the stopper 9 than the center (in the component transport direction) of the foremost chip component displaced to the component take-out position. In other words, the difference is that the chip component P is taken out with the attracting nozzle KN (the center of which is offset relative to the stopper side from the center in the component transport direction) of the foremost chip component P displaced to the component take-out position. This configuration prevents the chip component P from being forwardly tipped by frictional resistance when it is taken out, even if the permanent magnet and the magnetic plate have high surface friction. The provision of the smoothed portion, as described above, provides better component unloading due to the effects discussed above.

Figure 27:
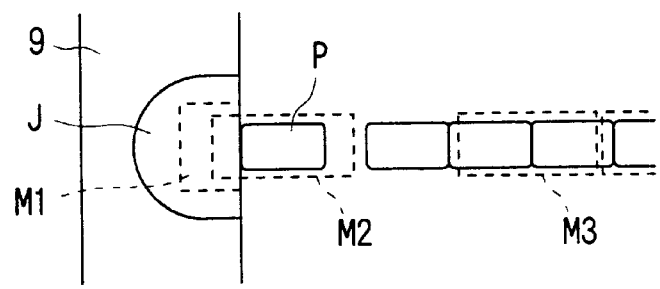
FIG. 27 is a diagram showing a variant of a third attracting section.

FIG. 27 is an illustration of a variant of the third attracting section, which differs from the third attracting section shown in FIGS. 1 to 15 in that (1) prism-like permanent magnets are used in the third attracting section M3 and (2) the width of each of the permanent magnets approximately equals the width of the chip component P to be fed. Thus, there is effective utilization of the magnetic force of the third attracting section M3 on the chip components P transported in alignment, and the magnetic force is prevented from reaching places other than where the chip components are being transported in alignment to prevent deviations in the path of the chip components. The same control of the magnetic field is achieved by using a non-magnetic mask plate or the like to control the exposed area (i.e., the magnetic flux passage area) of the disk-like permanent magnets.

It should be appreciated that although in the example per FIG. 27 the width of the magnetic flux passage region (the attracting effective region) of the third attracting section M3, on the side confronting the chip component P to be transported, is defined by the size or exposed area of the second attracting section MS, it may be defined in other ways.

Figure 28:
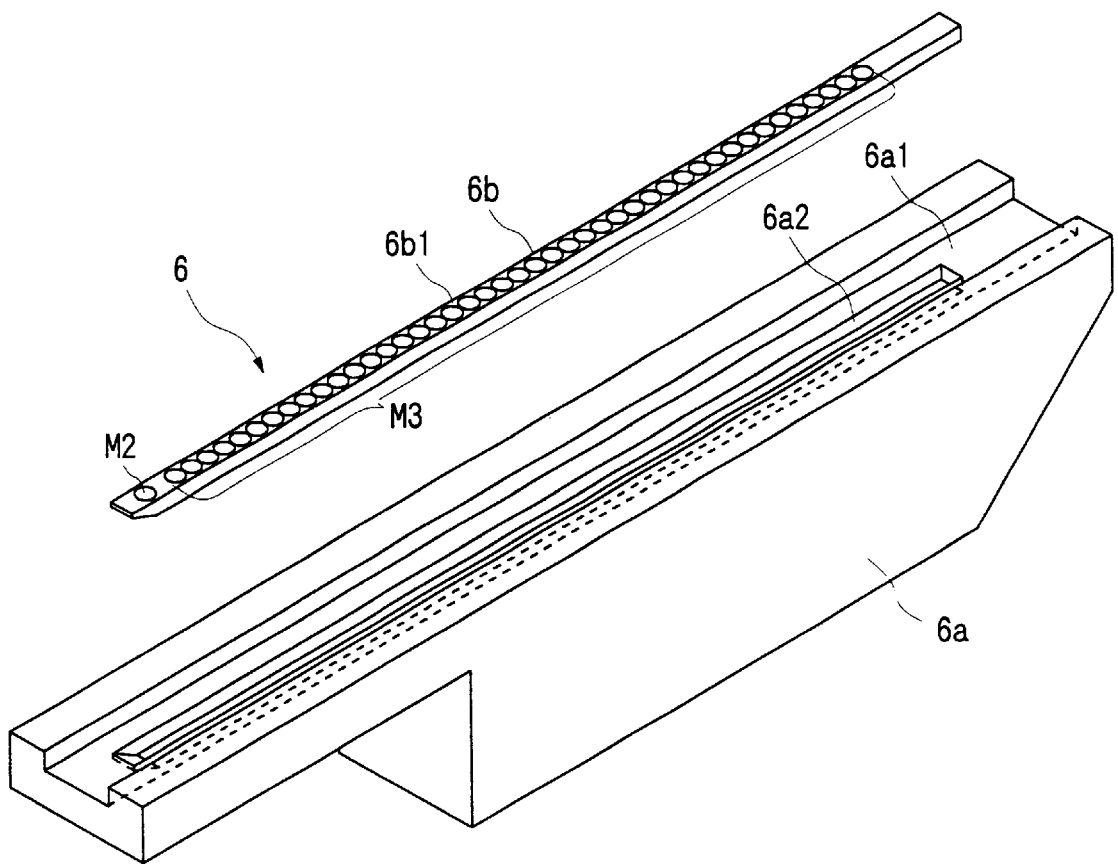
FIGS. 28(a) and 28(b) are perspective and plan views showing additional variants of second and third attracting sections.
Figure 28:
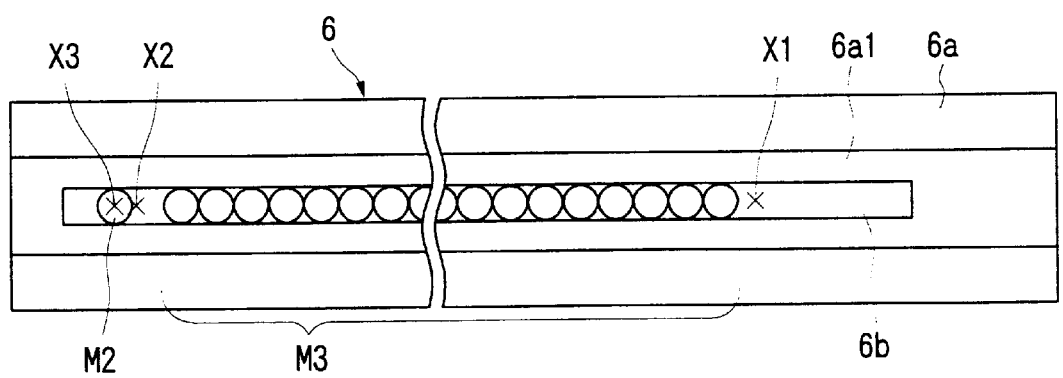

FIGS. 28(*a*), 28(*b*) and 29 are illustrations of variants of the second and third attracting sections, in which the belt guide 6 shown in the above-mentioned figures comprises a guide block 6*a* and an attracting plate 6*b* removably attached to the guide block 6*a*.

The top surface of guide block 6*a* includes an elongated guide groove 6*a*1 having a predetermined width and depth corresponding to the width and depth of belt 7. Guide block 6*a* is arranged below the component guide 5 with its side surface fixed to the frame 1, in such a manner that the center I in the width direction of the guide groove 6*a*1 coincides with the center in the width direction of the guide groove 5*a* of the component guide 5. Attachment groove 6*a*2, at the center in the width direction of the guide groove 6*a*1, has a shape corresponding to the contour of the attracting plate 6*b*.

The attracting plate 6*b* has a non-magnetic plate body 6*b*1 having an elongated rectangular shape; the second and third attracting sections M2 and M3 are located on the plate body 6*b*1 in such a manner that one of the magnetic pole surfaces is exposed to the top surface side. The attracting plate 6*b* is removably attached to the attachment groove 6*a*2 by screwing, pressure fitting, or the like, in such a manner that the top surface of the plate body 6*b*1 coincides with the bottom surface of the guide groove 6*a*1.

The third attracting section M3 of these variants is like that shown in FIGS. 1 to 15 and comprises a plurality of rare-earth permanent magnets having a disk-like shape. Each of the permanent magnets has a top surface substantially coincident with the top surface of the plate, and the magnets are implanted in the plate body 6*b*1 so that they are spaced equally apart from one another along the center in the width direction of the plate. The third attracting section M3 is arranged correspondingly to the region for use in the component transport of the belt 7, with the permanent magnets being arranged in such a manner that starting from the foremost permanent magnet the "north" and "south" poles of successive magnet alternate in sequence.

The second attracting section M2 of these variants is also like that shown in FIGS. 1 to 15, being comprised of a plurality of rare-earth permanent magnets having a disk-like shape. Each of the permanent magnets has a top surface substantially coincident with the top surface of the plate and is implanted in the plate body 6b1 so that the magnets of section M2 are spaced from the third attracting section M3 by a distance corresponding to at least one chip component P. Furthermore, the polarity of the surface confronting the belt 7, of the permanent magnets constituting the second attracting section M2 is that of the "south" pole, which is opposite to the polarity, i.e., "north" pole of the side confronting the foremost chip component P of the first attracting section M1.

If the chip component feeder deals with chip components P having different sizes, attracting plate 6b is replaced with one having a permanent magnet of a size matching the chip components P to be handled. Such an attracting plate 6b enables the above-described intimate chip component contact function to be attained to ensure improved component transport and take-out.

Figure 29:
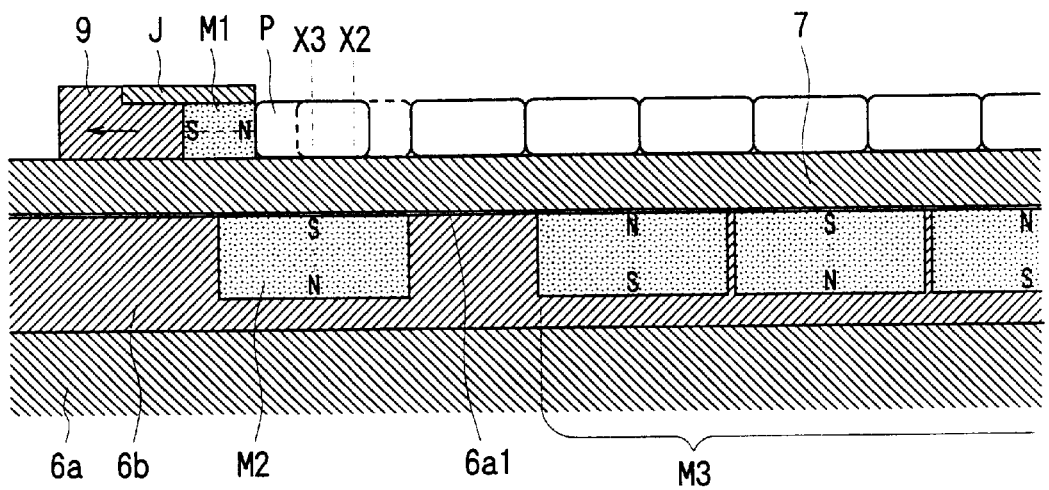
FIG. 29 is a sectional view showing a positional relationship between a chip component displaced to the component take-out position and the first and second attracting sections, per the variant shown in FIG. 28.
Figure 30:
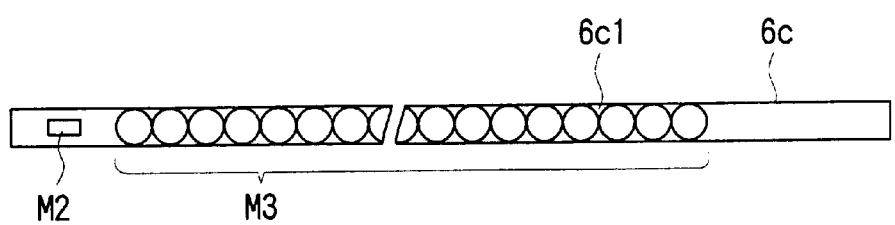
FIGS. 30(a) and 30(b) are diagrams showing respective variant of the attracting plate.
Figure 30:
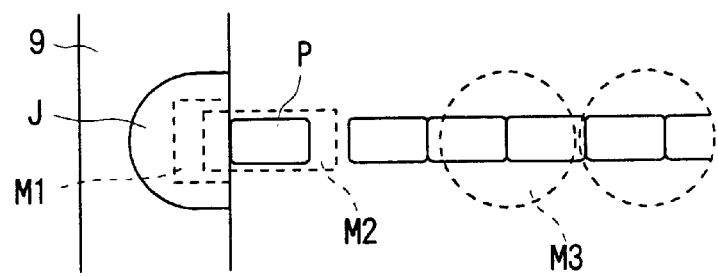

FIG. 30 is an illustration of a variant of the attracting plate which differs from the attracting plate shown in FIGS. 28 and 29 in that (1) a prism-like permanent magnet is used as the second attracting section M2 and (2) the width of the second attracting section M2 is approximately the same as the width of the chip component P to be transported. This configuration allows the magnetic force of the second attracting section M2 to effectively act on the foremost chip component P displaced to the component stop position, thus preventing the magnetic force from reaching an area other than that occupied by chip components P at that position, and thus preventing deviation of the path of the chip components. The magnetic field is controlled in the same manner as described by using a non-magnetic mask plate or the like to control the shape of the exposed portion (the magnetic flux passage region) of the permanent magnets constituting the disk-like shape.

Figure 31:
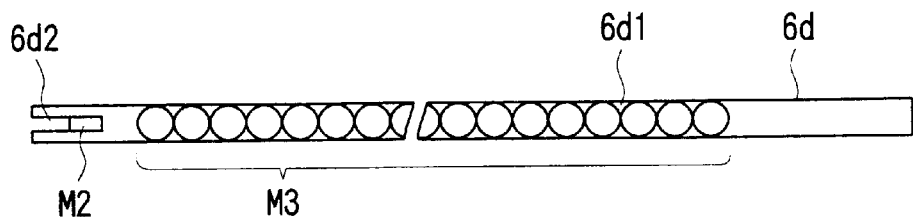
FIG. 31 is a diagram showing another variant of the attracting plate.

FIG. 31 is an illustration of a variant of the attracting plate which differs from the attracting plate shown in FIGS. 28 and 29 because (1) a slit 6d2 mounts the second attracting section (i.e., the permanent magnet) M2 on the extremity of the plate body 6d1 and (2) the second attracting section M2 having a prism-like shape is attached to the slit 6d2 by procedures such as press-fitting or adhesion. This configuration enables the size (the length of the magnets in the shown embodiment) of the second attracting section M2 to be selected depending on the size of the chip components P to be fed. Accordingly, by previously preparing the attracting plate 6d so it has no second attracting section M2, the versatility of the system is enhanced by utilizing attracting plate 6d with each of the chip components having different sizes, thus reducing the economical burden required to prepare different attraction plates depending on the size of the chip components P.

The plate body constituting the attracting plate need not be formed from non-magnetic material, and the plate body can be formed from a strongly magnetic material such as iron or the like to prevent magnetic flux from each of the permanent magnets from leaking out in other than the upward direction, thug strengthening the magnetic force on the side confronting the belt. This arrangement allows the strong magnetic force to act only on the aligned translated chip components, to reduce the sizes and number of the permanent magnets, leading to reduced cost. Because the magnetic flux can only leak in the upward direction, adjacent apparatuses are not adversely affected by the magnetic force of the permanent magnets of the attracting plate to enable juxtaposition of a plurality of the chip component feeders.

Although in the above embodiments, the belt used for component transport is indicated as being a flat belt or a timing belt made of synthetic rubber or flexible resin, the belt can be made of a material having water attracting properties to enhance the contact of the belt with the components resting on the belt, to thereby ensure secure convenience of the chip components.

Although the above-described embodiments each employ a belt for the transport of the chip components, the chip components can be transported without a belt, e.g., by blowing air from the rear side of the passage of the component guide 5a or by sucking air from the front side of the same passage.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. An attracting plate for use in a chip component feeding apparatus, comprising:
   a plate having a structure enabling the plate to be removably attached to constituent elements of the feeding apparatus, said plate having an elongated rectangular shape and including one or more attracting sections for exerting a force in the direction of chip advancement on transported chip components for temporarily attracting the same to enable guided movement thereof in the advancement direction, at least one of said attracting sections having at least one attracting element having a circular cross-section in a plane parallel to the direction of chip advancement.

2. The attracting plate of claim 1, wherein:
   at least one of said attracting sections is arranged for attracting toward a passage the transported chip components fed in the advancement direction during the guided movement.

3. The attracting plate of claim 2, wherein:
   the chip components include magnetic material, at least one of said attracting sections including a series of permanent magnets carried by the plate,
   the permanent magnets for the series having polarized faces with alternating polarity for attracting the transported chip components, the polarized faces each having an extent in the perpendicular direction corresponding to the extent of the chip components in the perpendicular direction.

4. The attracting plate of claim 2, wherein:
   the chip components include magnetic material, at least one of said attracting sections includes a series of permanent magnets carried by the plate,
   the permanent magnets for the series have polarized faces with alternating polarity for attracting the transported chip components, the polarized faces each having an extent (a) in a first direction extending perpendicular to the direction of chip component advancement corresponding to the extent of the chip component length in the first direction and (b) in a second direction extending parallel to the direction of chip component advancement substantially greater than the extent of the chip component length in the second direction, the first and second directions being perpendicular to each other.

5. The attracting plate of claim 1, wherein:
   at least one of said attracting sections is arranged for attracting toward a passage a foremost chip component of the transported chip components displaced to a take-out position during the guided movement.

6. The attracting plate of claim 5, wherein:

the plate includes a slit for removably attaching a permanent magnet in a disposition toward the passage to which the foremost chip component is displaced to the take-out position.

7. The attracting plate of claim 5, wherein:

the chip components include magnetic material, at least one of said attracting sections including a permanent magnet carried by the plate, the permanent magnet having a pole face having a single polarity for attracting the foremost chip component of the transported chip components, the pole face having an extent in the perpendicular direction corresponding to the extent of the chip components in the perpendicular direction.

8. The attracting plate of claim 5, wherein:

the chip components include magnetic material, at least one of said attracting sections including a permanent magnet carried by the plate, the permanent magnet having a pole face having a single polarity for attracting the foremost chip component of the transported chip components, the pole face having an extent (a) in a first direction extending parallel to the direction of chip component advancement corresponding to the extent of the chip component length in the first direction and (b) in a second direction extending perpendicular to the direction of chip component advancement substantially greater than the extent of the chip component length in the second direction, the first and second directions being perpendicular to each other.

9. The attracting plate of claim 1, wherein:

at least one of said attracting sections is arranged for attracting toward a passage the transported chip components fed in the advancement direction and a foremost chip component of the transported chip components displaced to a take-out position during the guided movement.

10. The attracting plate of claim 9, wherein:

the chip components include magnetic material, the one or more attracting sections comprise two or more attracting sections collectively including a series of permanent magnets and another permanent magnet carried by the plate, the permanent magnets for the series having polarized faces with alternating polarity for attracting the transported chip components, the polarized faces each having an extent in the perpendicular direction corresponding to the extent of the chip components in the perpendicular direction, the permanent magnet not in said series having a pole face having a single polarity for attracting the foremost chip component of the transported chip components, the pole face having an extent in the perpendicular direction corresponding to the extent of the chip components in the perpendicular direction.

11. The attracting plate of claim 9, wherein:

the chip components include magnetic material, the one or more attracting sections a comprise two or more attracting sections collectively including a series of permanent magnets and another permanent magnet carried by the plate, the permanent magnets for the series having polarized faces with alternating polarity for attracting the transported chip components, the polarized faces each having an extent (a) in a first direction extending perpendicular to the direction of chip component advancement corresponding to the extent of the chip component length in the first direction and (b) in a second direction extending parallel to the direction of chip component advancement substantially greater than the extent of the chip component length in the second direction, the first and second directions being perpendicular to each other, the permanent magnet not in the series having a pole face having a single polarity for attracting the foremost chip component of the transported chip components, the permanent magnet having a pole face having a single polarity for attracting the foremost chip component of the transported chip components, the pole face having an extent (a) in a first direction extending perpendicular to the direction of chip component advancement corresponding to the extent of the chip component length in the first direction and (b) in a second direction extending parallel to the direction of chip component advancement substantially greater than the extent of the chip component length in the second direction, the first and second directions being perpendicular to each other.

12. The attracting plate of claim 1 in combination with a guide block, said guide block including an attachment groove with a shape corresponding to the contour of the plate for holding the attracting plate fixedly in place.

13. The attracting plate of claim 1 in combination with a belt for transporting the chip components.

14. The combination attracting plate and belt of claim 13, wherein:

at least a portion of said belt faces the one or more attracting sections without blockage from a belt support.

15. The attracting plate of claim 1, wherein:

at least one of said attracting sections has plurality of attracting elements each having a circular cross-section in a plane parallel to the direction of chip advancement.

* * * * *